United States Patent
Binnig et al.

(10) Patent No.: US 7,409,488 B2
(45) Date of Patent: Aug. 5, 2008

(54) DATA PROCESSING SYSTEM

(75) Inventors: Gerd K. Binnig, Wollerau (CH); Michel Despont, Adliwisil (CH); Urs T. Durig, Rueschilikon (CH); Walter Haberle, Waedenswil (CH); Peter Vettiger, Langnau am Albis (CH)

(73) Assignee: International Business Machines Inc, Armonk, NY (US)

( * ) Notice: Subject to any disclaimer, the term of this patent is extended or adjusted under 35 U.S.C. 154(b) by 488 days.

(21) Appl. No.: 10/623,916

(22) Filed: Jul. 21, 2003

(65) Prior Publication Data
US 2004/0019757 A1    Jan. 29, 2004

(30) Foreign Application Priority Data
Jul. 23, 2002    (EP)    .................................. 02405643

(51) Int. Cl.
*G06F 12/00* (2006.01)
(52) U.S. Cl. ........................ 711/101; 711/104
(58) Field of Classification Search ........................ None
See application file for complete search history.

(56) References Cited

U.S. PATENT DOCUMENTS

| | | | |
|---|---|---|---|
| 4,314,349 A * | 2/1982 | Batcher ...................... | 708/230 |
| 5,307,311 A * | 4/1994 | Sliwa, Jr. ..................... | 365/174 |
| 6,084,849 A * | 7/2000 | Durig et al. .................. | 369/126 |
| 6,275,434 B1 * | 8/2001 | Yamada et al. ............... | 365/206 |
| 6,865,645 B1 * | 3/2005 | Shum et al. .................. | 711/123 |
| 2002/0066855 A1* | 6/2002 | Choi et al. ................... | 250/234 |
| 2002/0162084 A1* | 10/2002 | Butts et al. .................... | 716/17 |
| 2005/0038950 A1* | 2/2005 | Adelmann ..................... | 711/1 |
| 2005/0130551 A1* | 6/2005 | Cross et al. ................... | 445/50 |

* cited by examiner

Primary Examiner—Reginald G. Bragdon
Assistant Examiner—Horace L. Flournoy
(74) Attorney, Agent, or Firm—Richard M. Goldman

(57) ABSTRACT

A data processing system comprises a local probe storage array having a plurality of sensors for reading data from a storage surface. A plurality of data processing elements are mounted on the storage array. Each data processing element is connected to different sensor of the array for processing data read by the connected sensor. The data processing elements may be logic gates for performing simple comparisons with input data. Alternatively, each data processing element may comprise more complex logic circuitry for performing more complex functions based on data read by the storage array. Such function may involve a combination of data read by the storage array and data input to the data processing system from an another source. Each data processing element may comprise a complete microprocessor system responsive to data read from the storage array. It will be appreciated that data processing elements may thought of as collectively constituting a form of CPU capable of acting upon data read from the storage array in a parallel and therefor high speed fashion.

7 Claims, 6 Drawing Sheets

DATA PROCESSING SYSTEM

FIELD OF THE INVENTION

The present invention relates to a data processing system comprising a local probe storage array.

BACKGROUND OF THE INVENTION

A data processing system typically comprises a memory for storing computer program code instructions and a central processing unit (CPU) for executing the computer program instructions. In operation, the memory also stores input data to be operated upon by the computer program code and output data produced by execution of the computer program code. In general, the computer program code can be divided into operating system code and application program code. The operating system code configures the CPU for executing the application program code. Conventionally, the memory is implemented by a combination of solid state memory such as random access memory and rotating disc mass data storage such as magnetic or optical disc storage.

A recent addition to the field of data storage technology is generally referred to as a local probe storage technology. As described in Vettiger et al. "*The Millipede*"—*More than one thousand tips for future AFM data storage*, P. Vettiger et al, *IBM Journal of Research and Development*. Vol.44 No.3, May 2000, a local probe storage array typically comprises a storage surface having a locally deformable film disposed thereon and an array of micro mechanical probe sensors each having a probe tip of atomic dimensions facing the coating. In operation, during a data write operation, the tips are brought into proximity to the storage surface. Energy is selectively applied to each tip, typically in the form of heating. The energy applied to the tips is transferred to the storage surface. The energy transfer produces a local deformation in the storage surface in the vicinity of each energized tip. The array of tips is moved relative to the storage surface between successive write operations in preparation for writing to new locations on the storage surface. During a read operation, the arrays tips are urged against the storage surface. Simultaneously, the tips are scanned relative to the storage surface. Local deformations of the storage surface produced during the aforementioned write operation produce deflections in the tips as they are scanned over the surface. Such deflections can be detected thermally or optically. The presence or absence of a local deformation in the storage surface by a tip can be detected as a stored "1" or stored "0".

SUMMARY OF THE INVENTION

In accordance with the present invention, there is now provided a data processing system comprising: a local probe storage array having a plurality of sensors for reading data from a storage surface; a plurality of data processing elements mounted on the storage array and each connected to different sensor of the array for processing data read by said connected sensor. The data processing elements may be logic gates for performing simple comparisons with input data. Alternatively, each data processing element may comprise more complex logic circuitry for performing more complex functions based on data read by the storage array. Such function may involve a combination of data read by the storage array and data input to the data processing system from an another source. Each data processing element may comprise a complete microprocessor system responsive to data read from the storage array. It will be appreciated that data processing elements may thought of as collectively constituting a form of CPU capable of acting upon data read from the storage array in a parallel and therefor high speed fashion.

The storage surface preferably comprises a plurality of data fields each corresponding to different one of the sensors and each having a matrix of bit storage locations individually addressable by the corresponding sensor. In a preferred embodiment of the present invention, the storage surface comprises a user data portion dedicated to storage of user data for manipulation by the processing elements, and a program code portion dedicated to storage of program code for configuring the processing elements to manipulate the user data. The program code portion and the user data portion may be located in different fields of the storage surface. Alternatively, each field of the storage surface may have at least one bit location assigned to the program code portion and at least one bit location assigned to the user data portion. Accordingly, the sensor associated with the field may switch between reading program code and data to be processed according to the program code.

In a particularly preferred embodiment of the present invention, each field of the storage surface has different bit locations assigned to different memory pages. The data processing system may further comprise a random access memory mounted on and connected to the data processing elements.

In a preferred embodiment of the present invention to be described shortly, the data processing elements comprise logic for comparing an input bit pattern with a bit pattern recorded on the storage surface. In a particularly preferred embodiment of the present invention, at least one of the data processing elements comprises a microprocessor.

Viewing the present invention from another aspect, there is now provided a data processing method comprising: reading data from a storage surface via sensors of a local probe storage array; and processing the data read from the surface via a plurality of data processing elements mounted on the storage array and each connected to a corresponding one of the sensors of the array.

Viewing the present invention from yet another aspect, there is now provided a memory for storing data comprising a local probe storage array having a plurality of sensors for reading data from a storage surface, the storage surface comprising a plurality of data fields each corresponding to different one of the sensors and each having a matrix of bit storage locations individually addressable by the corresponding sensor, wherein each field of the storage surface has different bit locations assigned to different memory pages.

Viewing the present invention from a further aspect, there is now provided a method for storing data in a local probe storage array having a plurality of sensors for reading data from a storage surface, the storage surface comprising a plurality of data fields each corresponding to different one of the sensors and each having a matrix of bit storage locations individually addressable by the corresponding sensor, the method comprising assigning different bit locations of each field of the storage surface to different memory pages.

THE FIGURES

Preferred embodiments of the present invention will now be described, by way of example only, with reference to the accompanying Figures, in which.

DETAILED DESCRIPTION

Figure 1:
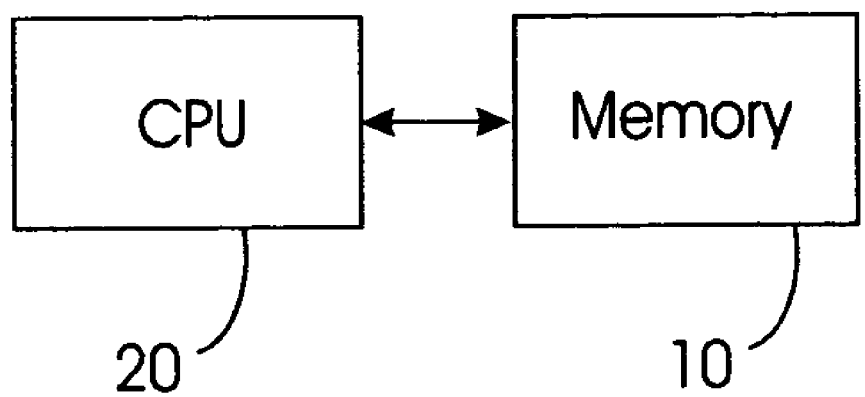
FIG. 1 is a block diagram of a data processing system.

Referring first to FIG. 1, an example of a data processing system comprises a memory 10 for storing computer program code instructions and a CPU 20 for executing the computer program instructions. In operation, the memory 10 also stores input data to be operated upon by the computer program code and output data produced by execution of the computer program code in the CPU 20. The computer program code is divided into operating system code and application program code. The operating system code configures the CPU 20 for executing the application program code.

Figure 2:
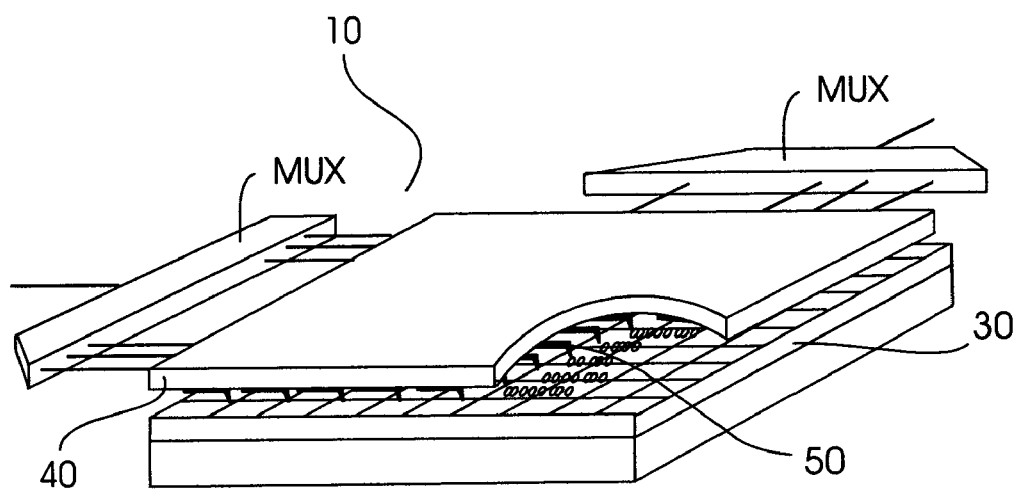
FIG. 2 is an isometric view of a local probe storage array.

Referring now to FIG. 2, in a preferred embodiment of the present invention, the memory 10 of the data processing system comprises a local probe storage array. The local probe storage array comprises a storage surface 30 having a locally deformable film disposed thereon and an array of micro mechanical probe sensors 40 each having a probe tip 50 of atomic dimensions facing the coating. In operation, during a data write operation, the tips 50 are brought into proximity to the storage surface 30. Energy is selectively applied to each tip 50, typically in the form of heating. The energy applied to the tips 50 is transferred to the storage surface 30. The energy transfer produces a local deformation in the storage surface 30 in the vicinity of each energized tip 50. The array 40 of tips 50 is moved relative to the storage surface 30 between successive write operations in preparation for writing to new locations on the storage surface 30. During a read operation, the array 40 of tips 50 are urged against the storage surface 30. Simultaneously, the tips 50 are scanned relative to the storage surface 30. Local deformations of the storage surface 30 produced during the aforementioned write operation produce deflections in the tips 50 as they are scanned over the surface 30. Such deflections can be detected thermally or optically. The presence or absence of a local deformation in the storage surface 30 by a tip 50 can be detected as a stored "1" or stored "0".

Figure 3:
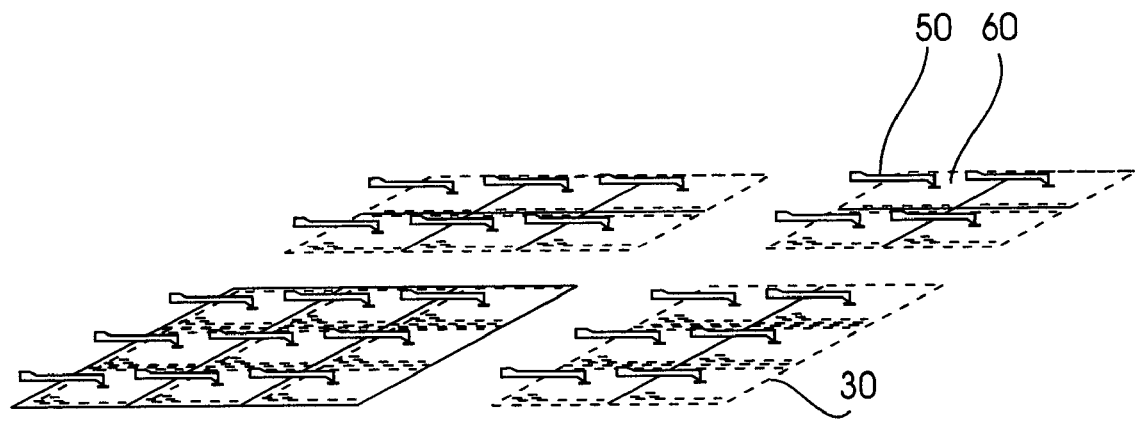
FIG. 3 is an isometric view of a storage surface of the local probe storage array.

With reference to FIG. 3, it will be appreciated that each tip 50 of the array 40 scans a separate field 60 of the storage surface 30.

Figure 4:
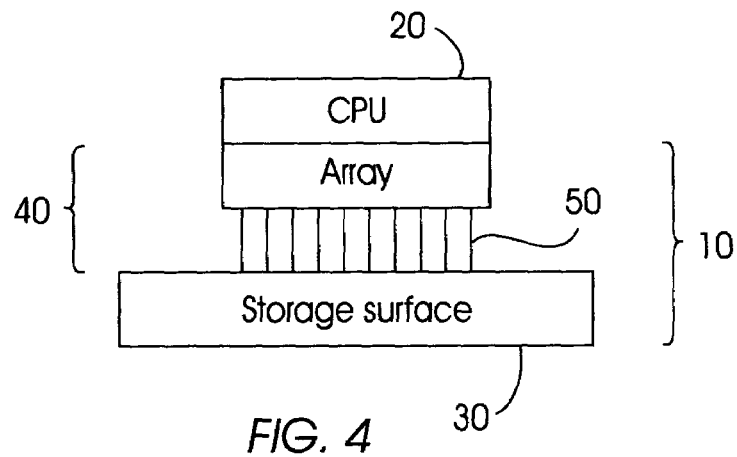
FIG. 4 is a block diagram of a data processing system embodying the present invention.

Turning to FIG. 4, in a preferred embodiment of the present invention, there is provided a data processing system in which the CPU 20 is mounted on a local probe storage array 40 as herein before described. In operation, the CPU 20 converts signals from individual sensors 50 into bits. The CPU 20 also interconnects the sensors 50 logically. In addition, the CPU 20 connects the sensors 50 to input data to be written into the memory 10. A string of data recorded in conventional storage corresponds to a two dimensional (2D) pattern recorded in the memory 10. Because the CPU 20 is connected to all sensors 50 of the memory 10 in parallel, a form of instantaneous pattern recognition can be performed by the CPU 20. A 2D pattern of input data can be compared by the CPU 20 with a 2D pattern of data stored in the memory 10 and logically processed by the CPU 20. Examples of such logical processing include identifying a desired pattern by finding the best fit of input data to stored data.

Figure 5:
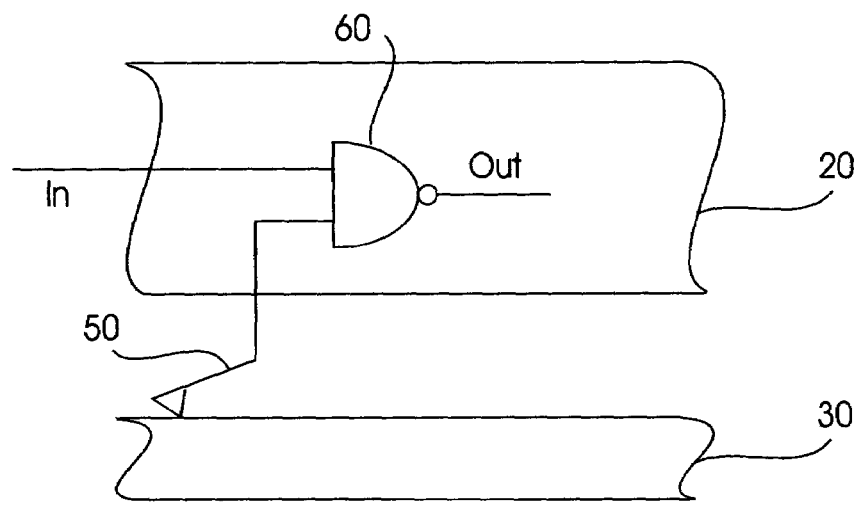
FIG. 5 is another block diagram of a data processing system embodying the present invention.

One application of such logical processing is in the field of speech recognition. However, it will be appreciated that other fields of application are also possible. Referring now to FIG. 5, in the speech recognition application, speech is initially converted into a normalized digital form which in which variations present in ordinary speech, such as variations in base frequency or speed of delivery, are omitted. In other words, bare features are extracted from the input speech. Such features characterize normalized speech objects such as words. Each object is converted into a bit-string. The CPU 20 translates each bit string into a 2D input pattern of bits. Each bit in the input pattern corresponds to a bit (0 or 1) of a 2D pattern of bits recorded on the storage surface 30 of the memory 10. Each bit of the input pattern is connected, via the CPU 20 to the input of a two input NAND function 60 implemented in the CPU 20. The other input of the NAND function 60 is connected to the corresponding bit of the recorded pattern read from the storage surface 30. The output of the NAND function 60 is a "0" only if both the input bit and the recorded bit are equal. The outputs of the NAND functions 60 are added up by the CPU 20. If the sum of the outputs of the NAND gates is zero, the match between the recorded pattern to input pattern is determined by the CPU 20 to be perfect. For a fuzzy match, the sum may deviate from zero and the lowest value remembered by the CPU 20. When the patterns are scanned again, the best fit is identified by the CPU 20 when the remembered value matches the sum of the NAND functions 60. For distinguishing around 16000 words from each other, 14 bits are required. This corresponds to a 2 by 7 sensor field of the storage surface 30. For an array of 1400 sensors, 100 words can be scanned at once within 1 to 10 microseconds. All 16000 words can then be scanned in 40 to 400 microseconds.

The speech recognition application herein before described is a simple example to explain the principle of logically processing data recorded in the memory 10 by the CPU 20. With 1 million sensors, more complex search tasks may be fulfilled in an extremely short time. For example, it would be desirable to provide a search engine which operates massively in parallel in order to expedite data searches. However, this requires interconnecting parallel operating units to communicate as fast as possible. As herein before described with reference to FIG. 4, such parallel operation may be achieved a data processing system embodying the present invention. When for example the location of a best fit between a search argument and recorded data is found by the CPU 20, selected fields 60 of the memory 10 can be triggered into an output producing mode. These fields 60 may for example contain codes for text. For example, data representative of the sound of a input word may be found and converted into corresponding text of the word. Other operations may be triggered in addition, such as writing results into one field 60 of the memory 10 based on processing of data found in another field 60.

Conventional programmable processors can fulfill very general tasks. Conversely, application specific electronics dedicated to particular tasks is usually more efficient and faster than conventional processors. A trend in processor design is therefore towards increasing integration of application specific tasks that can be at least partially executed in parallel. Examples of the data processing system herein before described with reference to FIG. 4 comprise hybrids of mechanical and electronic functionality. Such systems can serve as a search engine as herein before described. This is one example of an application which can be performed faster by a data processing system embodying the present invention than by a conventional microprocessor.

Figure 6:
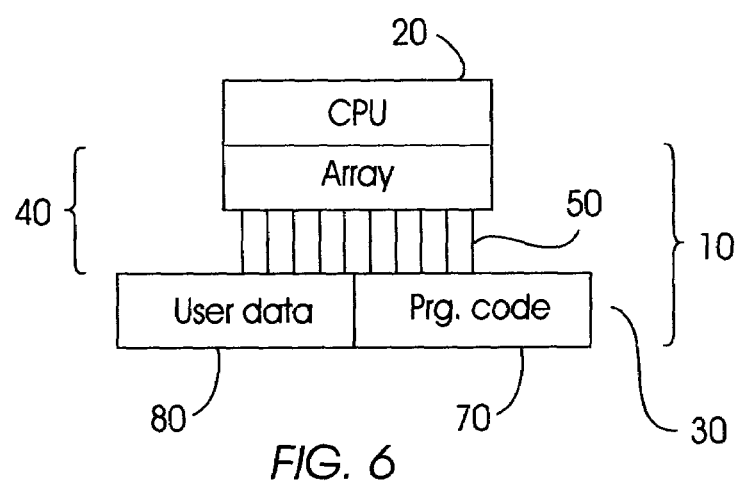
FIG. 6 is yet another block diagram of a data processing system embodying the present invention.
Figure 7:
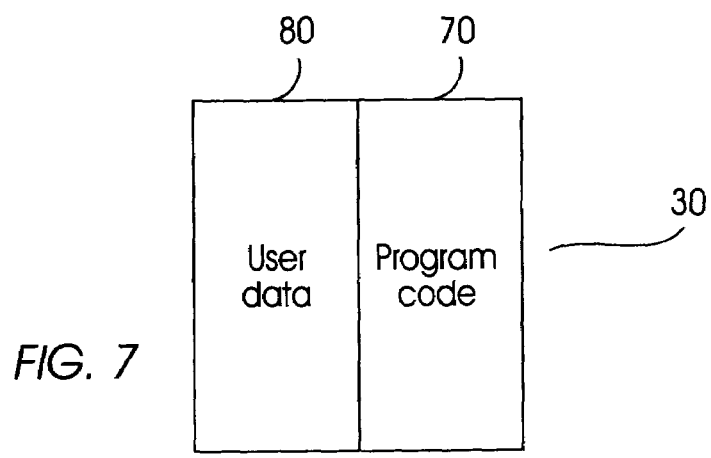
FIG. 7 is a plan view of a storage surface of the data processing system shown in FIG. 6.
Figure 8:
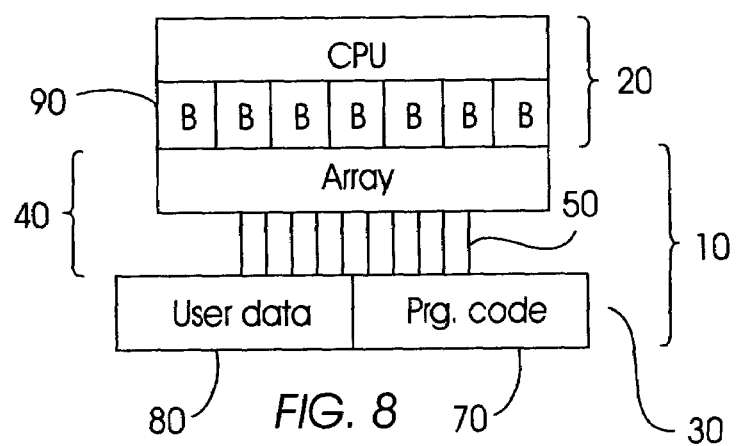
FIG. 8 is another block diagram of a data processing system embodying the present invention.

Referring now to FIG. 6, in a preferred embodiment of the present invention, the array 40 acts as high speed switch for switching the CPU 20 between different functional states. Direct and fast switching of the CPU 20 is facilitated by mounting the CPU 20 on the array 40. Each sensor 50 in the array 40 is connected to a corresponding point in the CPU 20 via a direct and local electrical connection. The array 40 reads data to be processed. However, the array 40 also determines how the data is to be processed. Specifically, referring now to FIGS. 6 and 7 in combination, there is a section 80 of the storage medium 30 in which user data to be processed is stored. The user data is fed directly fed into the CPU 20 for processing. In another section 70 of the storage surface 30, program data is stored. The program data locally modifies the state of gates in the CPU 20 to define the manner in which the user data is processed. The CPU 20 can be switched between many different processing procedures because many different bit patterns can be stored in and read from program carrying portion 70 of the storage medium 30. Referring to FIG. 8, in a particularly preferred embodiment of the present invention, the CPU 20 is, the interests of efficiency, designed as a set of functional building blocks 90 with different combinations of the blocks 90 corresponding to different bit patterns recorded in the program carrying portion 70 of the storage medium 30. Each bit-pattern then defines which block or blocks 90 in the CPU 20 become active for a given task.

In another preferred embodiment of the present invention, the CPU 20 comprises an array of processing elements. The processing elements may be individual microprocessors. In operation, the array 40 captures bit patterns. The bit patterns are distributed over the processing elements constituting the CPU 20. Each of the processing elements can be activated individually, according to the bit pattern read by the array 40. This architecture provides highly flexible and fast data processing.

Figure 9:
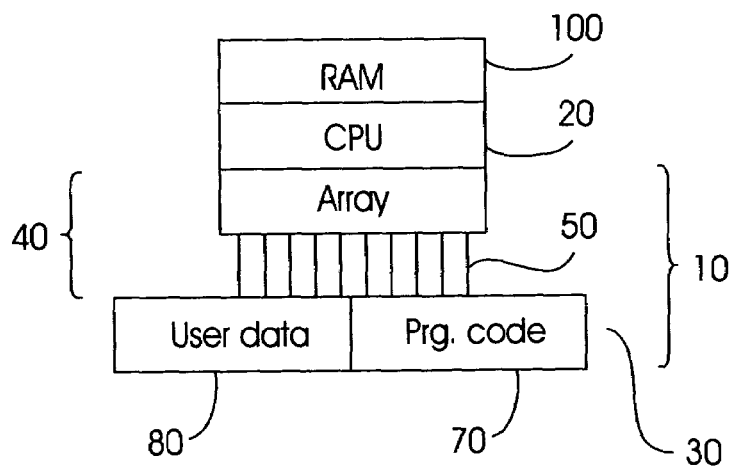
FIG. 9 is yet another block diagram of a data processing system embodying the present invention.

With reference now to FIG. 9, in a particularly preferred embodiment the present invention, the data processing system comprises a conventional solid state random access memory (RAM) 100 connected to the CPU 20 in addition to the local probe storage array 40. In operation, user data is read from a portion 80 of the storage surface 30 and transferred to the RAM 100. Bit patterns stored in another portion 70 of the storage surface 30 then configure the CPU 20 into one of range of operating modes for acting on the user data now stored in the conventional memory 100. It will be appreciated that the modes may be changed during processing of the data by the array 40 accessing a different bit pattern from the storage surface 30.

Figure 10:
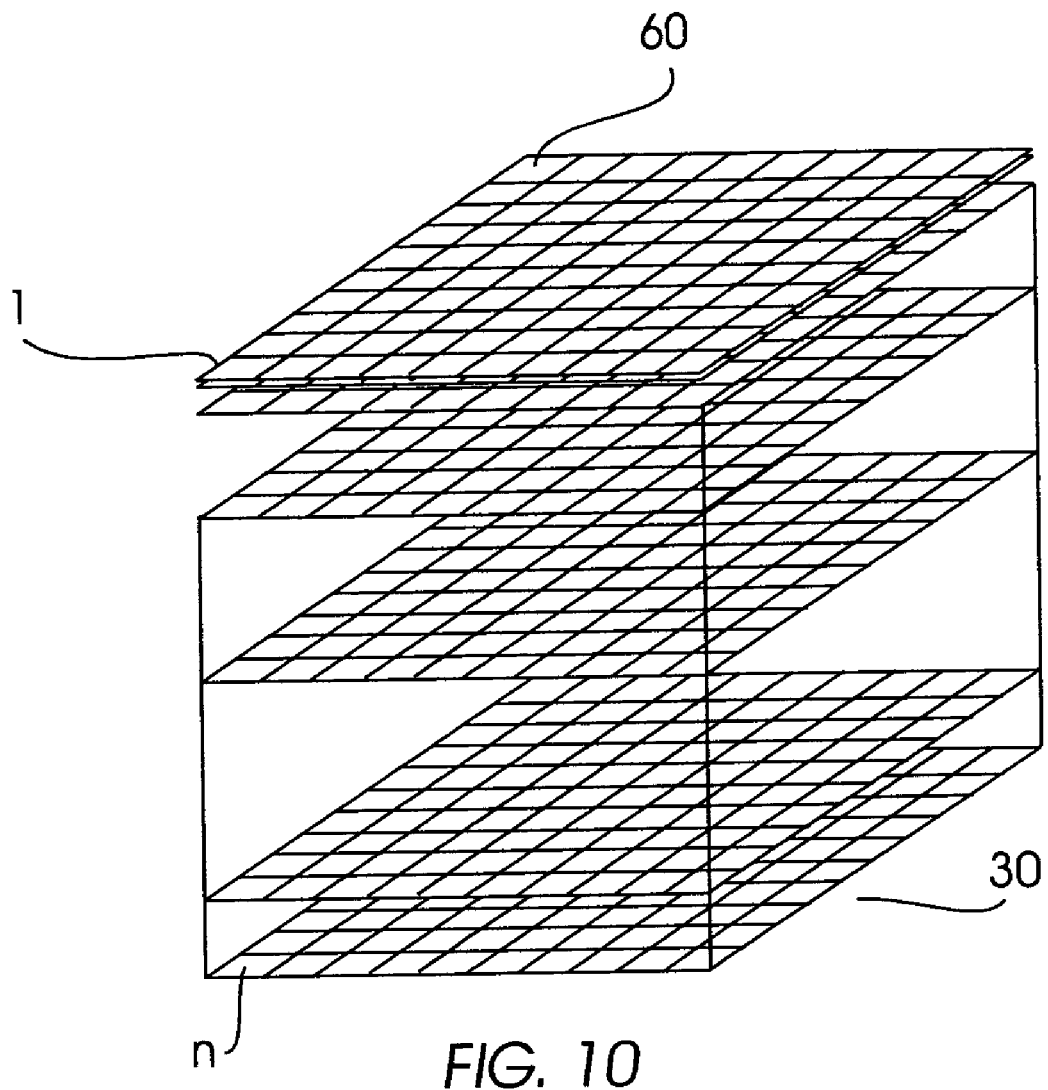
FIG. 10 is a block diagram of a memory for a data processing system embodying the present invention; and, FIG. 11 is an isometric view of part of the memory shown in FIG. 10.
Figure 11:
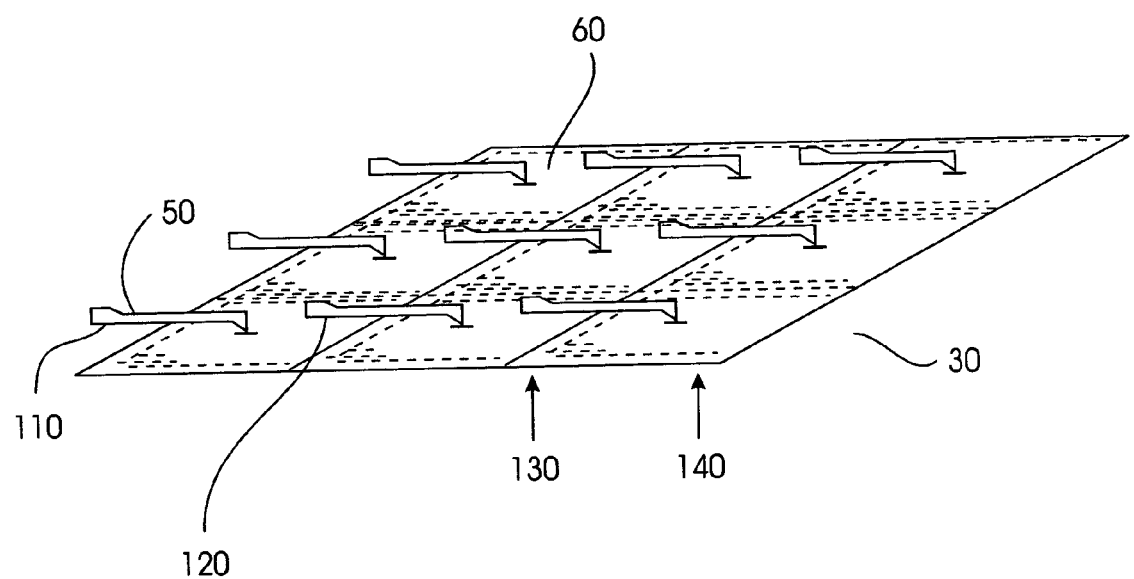

In the embodiments of the present invention herein before described, different portions of the storage surface 30 are assigned to the storage of different forms of information, such as user data and program code. In other embodiments of the present invention, different fields 60 of the storage surface 30 may be dedicated to storage of different forms of data. In further embodiments of the present invention, different bit storage locations on the storage surface 30 may be dedicated to storage of different forms of data. Some locations may be dedicated to the storage of user data. Other locations may dedicated to the storage of the program code. Accordingly, the sensor 50 assigned to such locations may switch between reading program code and reading data to be processed by the program code as the corresponding field 60 is scanned. It will now be appreciated that the memory 10 can be provided with a logical structure coexisting with its physical structure. For example, referring now to FIG. 10 in a preferred embodiment of the present invention, the memory 10 is split into a plurality of logical pages 1 to n. Each scan position of the array 40 relative to the storage surface 30 corresponds to one of the pages 1 to n. By moving the array 40 to a new location, a new one of the pages 1 to n is addressed. The page size is defined by the number of sensors 50 in the array 40. Each bit logically stored in a page is physically stored in a separate field 60 on the storage surface 30. Each bit stored in a field 60 of the storage surface thus corresponds to a bit stored in separate on of the logical pages 1 to n. For example, referring to FIG. 11, at 110, sensor (0,0) at location (x,y) points to bit (0,0) on page (x,y). At 120, sensor (0,1) at position (x,y) points to bit (0,1) on page (x,y). At 130, bit (0,2) of page (0,0) is stored. Similarly, at 140, bit (0,2) of page (0,n−1) is stored. It will be appreciated that in other embodiments of the present invention, there may be different mappings between the logical pages of the memory 10 and the fields 60 of the storage surface 30

In a particularly preferred embodiment of the present invention, each page has around 1 Megabyte of data storage capacity. The data access time associated with each page is similar to that found in conventional SRAM technology. In a particularly preferred embodiment of the present invention, the memory 10 comprises around 1 million pages, thus providing a total capacity of an 100 Gigabyte in a chip package of around 4 cm×4 cm×3 mm. It will be appreciated that, in other embodiments of the present invention different numbers of pages, different storage density, and/or different form factors are possible. Data stored in the memory 10 may be split between the pages by subject. Access times for reading and writing such data is relatively short. If the subject is changed, the access speed is not critical. Additional time is available to open a new page. This concept is advantageous for applications such as image processing, speech processing, databases and the like.

While our invention has been descibed and illustrated with respect to certain preferred embodiments and exmplifications, it is not intended to limit the scope of the invention thereby, but solely by the claims appended hereto.

The invention claimed is:

1. A data processing system comprising: a CPU, storage surface, a local probe storage array having a plurality of sensors for reading data from the storage surface; a plurality of data processing elements mounted on the storage array and each connected to different sensor of the array for processing data read by said connected sensor, said storage surface comprising a plurality of data fields each data field corresponding to a different one of the sensors, each data field having a matrix of bit storage locations individually addressable by a corresponding sensor, and the storage surface comprising a user data portion dedicated to storage of user data for manipulation by the processing elements, and a program code portion dedicated to storage of program code for configuring the processing elements to manipulate the user data, said CPU mounted on said array and switchable between different functions, with each sensor connected to a corresponding point on the CPU via a direct local electrical connection, and a random access memory mounted on and connected to the CPU.

2. A data processing system as claimed in claim 1, wherein the program code portion and the user data portion are located in different fields of the storage surface.

3. A data processing system as claimed in claim 1, wherein each field of the storage surface has at least one bit location assigned to the program code portion and at least one bit location assigned to the user data portion.

4. A data processing system as claimed in claim 1, wherein each field of the storage surface has different bit locations assigned to different memory pages.

5. A data processing system as claimed in claim 1, further comprising a random access memory mounted on and connected to the data processing elements.

6. A data processing system as claimed in claim 1, wherein the data processing elements comprise logic for comparing an input bit pattern with a bit pattern recorded on the storage surface.

7. A data processing method comprising:

reading data from a storage surface via sensors of a local probe storage array; and processing the data read from the surface via a plurality of data processing elements and a CPU mounted on the storage array and each connected to a corresponding one of the sensors of the array said storage surface comprising a plurality of data fields each data field corresponding to a different one of the sensors, each data field having a matrix of bit storage locations individually addressable by a corresponding sensor, and the storage surface comprising a user data portion dedicated to storage of user data for manipulation by the processing elements, and a program code portion dedicated to storage of program code for configuring the processing elements to manipulate the user data, said CPU switchable between different functions, with each sensor connected to a corresponding point on the CPU via a direct local electrical connection, and a random access memory mounted on and connected to the CPU.

\* \* \* \* \*